US009654112B2

(12) United States Patent
Kawai

(10) Patent No.: US 9,654,112 B2
(45) Date of Patent: May 16, 2017

(54) SIGNAL INVERTING DEVICE, POWER TRANSMISSION DEVICE, AND NEGATIVE-VOLTAGE GENERATING CIRCUIT

(71) Applicant: Panasonic Corporation, Osaka (JP)

(72) Inventor: Yasufumi Kawai, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/970,835

(22) Filed: Dec. 16, 2015

(65) Prior Publication Data

US 2016/0211840 A1 Jul. 21, 2016

(30) Foreign Application Priority Data

Jan. 21, 2015 (JP) ................................ 2015-009843

(51) Int. Cl.
*H03K 19/20* (2006.01)

(52) U.S. Cl.
CPC .................................... *H03K 19/20* (2013.01)

(58) Field of Classification Search
CPC ........ H03K 17/10; H03K 17/12; H03K 17/16; H03K 17/30; H03K 17/164; H03K 17/691; H03K 17/64; H03K 17/60; H03K 17/56
USPC ......................... 327/108, 109, 110, 111, 112
See application file for complete search history.

(56) References Cited

U.S. PATENT DOCUMENTS

2014/0049297 A1 2/2014 Nagai et al.
2015/0234417 A1* 8/2015 Kawai ..................... G05F 5/00 323/299

FOREIGN PATENT DOCUMENTS

WO 2013/065254 5/2013

* cited by examiner

*Primary Examiner* — John Poos
(74) *Attorney, Agent, or Firm* — McDermott Will & Emery LLP

(57) ABSTRACT

A signal inverting device generates an inverted signal of an input signal. The device includes a normally-on transistor, a negative-voltage generating unit that generates a negative voltage, and an output terminal. A first terminal of the normally-on transistor is connected to a current source. The output terminal is connected between the first terminal of the normally-on transistor and the current source. The normally-on transistor is turned on/off, by an input of a drive signal to a conduction control terminal of the normally-on transistor. The drive signal is a signal obtained by a synthesis of the input signal and the negative voltage. The inverted signal is output from the output terminal in accordance with the on/off operation of the normally-on transistor. The negative-voltage generating unit generates the negative voltage by rectifying a high-frequency power.

16 Claims, 14 Drawing Sheets

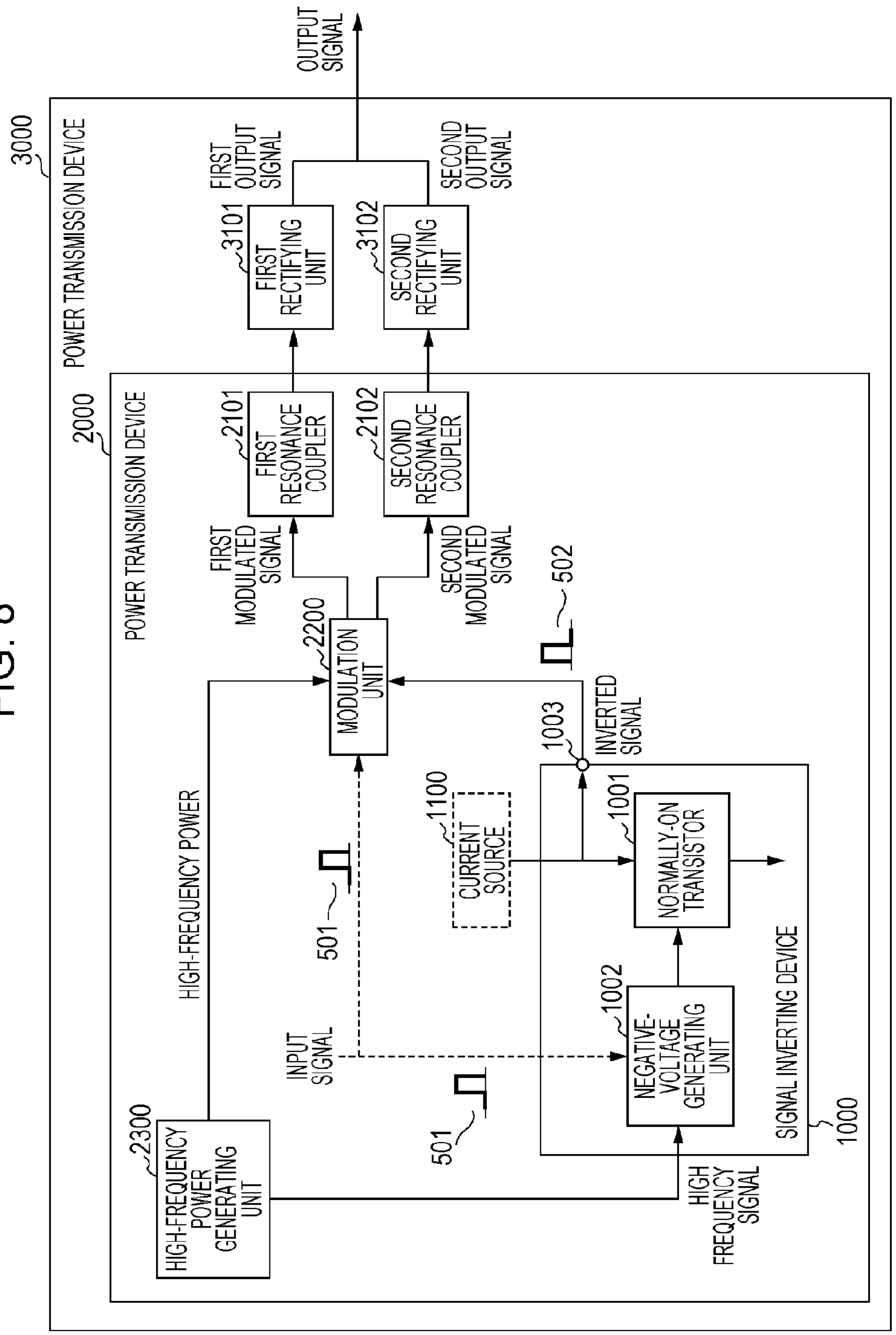
FIG. 8
3000
POWER TRANSMISSION DEVICE
2000
POWER TRANSMISSION DEVICE
OUTPUT SIGNAL
FIRST OUTPUT SIGNAL
SECOND OUTPUT SIGNAL
3101
FIRST RECTIFYING UNIT
3102
SECOND RECTIFYING UNIT
2101
FIRST RESONANCE COUPLER
2102
SECOND RESONANCE COUPLER
FIRST MODULATED SIGNAL
SECOND MODULATED SIGNAL
2200
MODULATION UNIT
502
1003
INVERTED SIGNAL
HIGH-FREQUENCY POWER
501
1100
CURRENT SOURCE
1001
NORMALLY-ON TRANSISTOR
INPUT SIGNAL
1002
NEGATIVE-VOLTAGE GENERATING UNIT
SIGNAL INVERTING DEVICE
1000
2300
HIGH-FREQUENCY POWER GENERATING UNIT
501
HIGH FREQUENCY SIGNAL

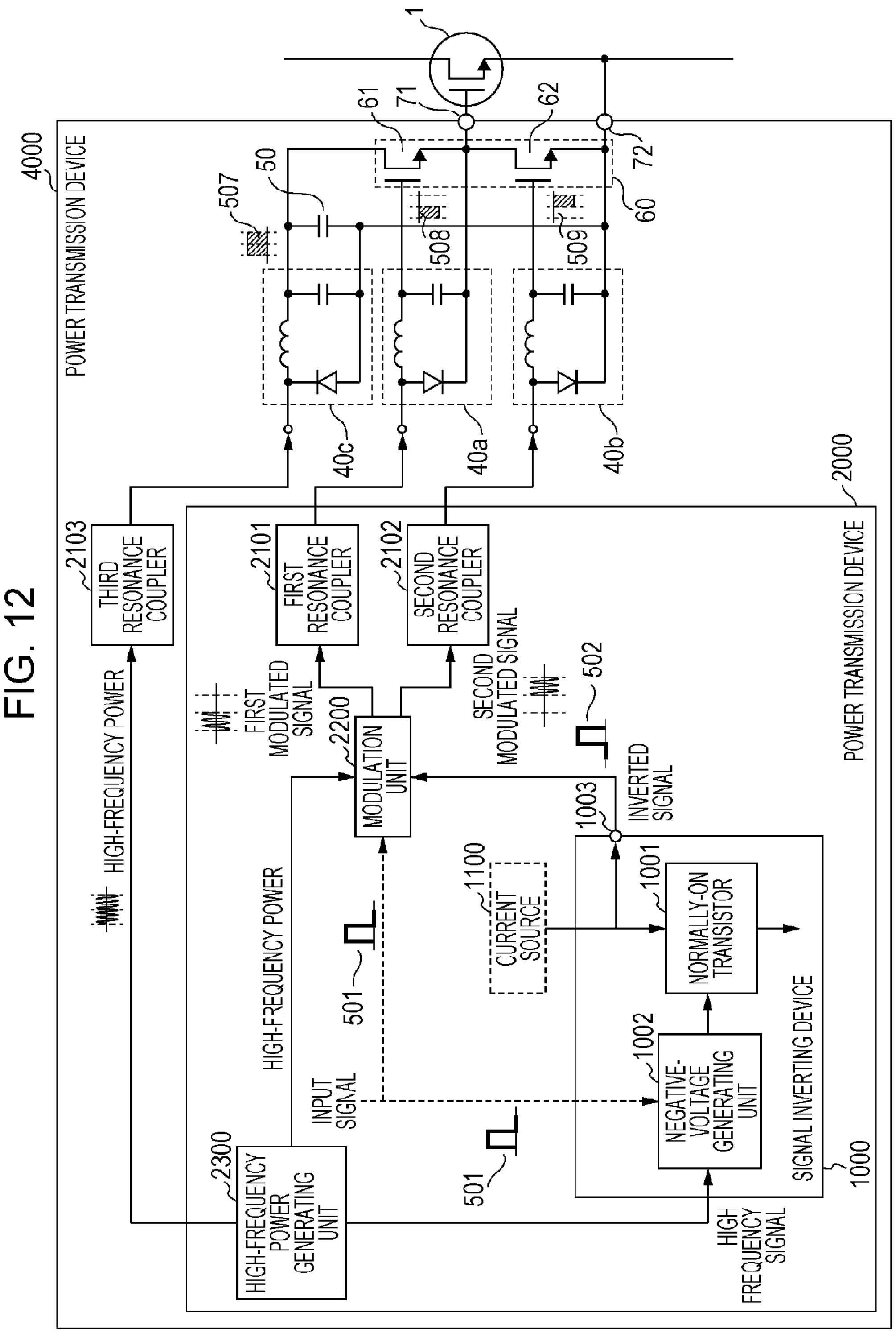
FIG. 12
4000
POWER TRANSMISSION DEVICE
1
61
71
62
72
50
507
508
509
60
40c
40a
40b
2000
2103
THIRD RESONANCE COUPLER
2101
FIRST RESONANCE COUPLER
2102
SECOND RESONANCE COUPLER
HIGH-FREQUENCY POWER
FIRST MODULATED SIGNAL
SECOND MODULATED SIGNAL
502
2200
MODULATION UNIT
POWER TRANSMISSION DEVICE
HIGH-FREQUENCY POWER
INVERTED SIGNAL
1003
1001
NORMALLY-ON TRANSISTOR
1100
CURRENT SOURCE
501
1002
NEGATIVE-VOLTAGE GENERATING UNIT
SIGNAL INVERTING DEVICE
1000
INPUT SIGNAL
501
2300
HIGH-FREQUENCY POWER GENERATING UNIT
HIGH FREQUENCY SIGNAL

SIGNAL INVERTING DEVICE, POWER TRANSMISSION DEVICE, AND NEGATIVE-VOLTAGE GENERATING CIRCUIT

BACKGROUND

1. Technical Field

The present disclosure relates to a signal inverting device which inverts a signal.

2. Description of the Related Art

For example, in International Publication No. 2013/065254, a power transmission device using high-frequency power is disclosed.

In the related art, high-frequency power fails to be used for generating an inverted signal.

SUMMARY

In one general aspect, the techniques disclosed here feature a signal inverting device generating an inverted signal of an input signal. The device includes a normally-on transistor, a negative-voltage generating unit that generates a negative voltage, and an output terminal. A first terminal of the normally-on transistor is connected to a current source. The output terminal is connected between the first terminal of the normally-on transistor and the current source. The normally-on transistor is on/off, by an input of a drive signal to a conduction control terminal of the normally-on transistor. The drive signal is a signal obtained by a synthesis of the input signal and the negative voltage. The inverted signal is output from the output terminal in accordance with the on/off operation of the normally-on transistor. The negative-voltage generating unit generates the negative voltage by rectifying a high-frequency power.

The present disclosure enables high-frequency power to be used for generating an inverted signal.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 8 is a diagram illustrating a general configuration of power transmission devices according to a second embodiment;

FIG. 12 is a diagram illustrating a general configuration of a power transmission device according to a third embodiment;

DETAILED DESCRIPTION

Embodiments of the present disclosure will be described below with reference to the drawings.

First Embodiment

Figure 1:
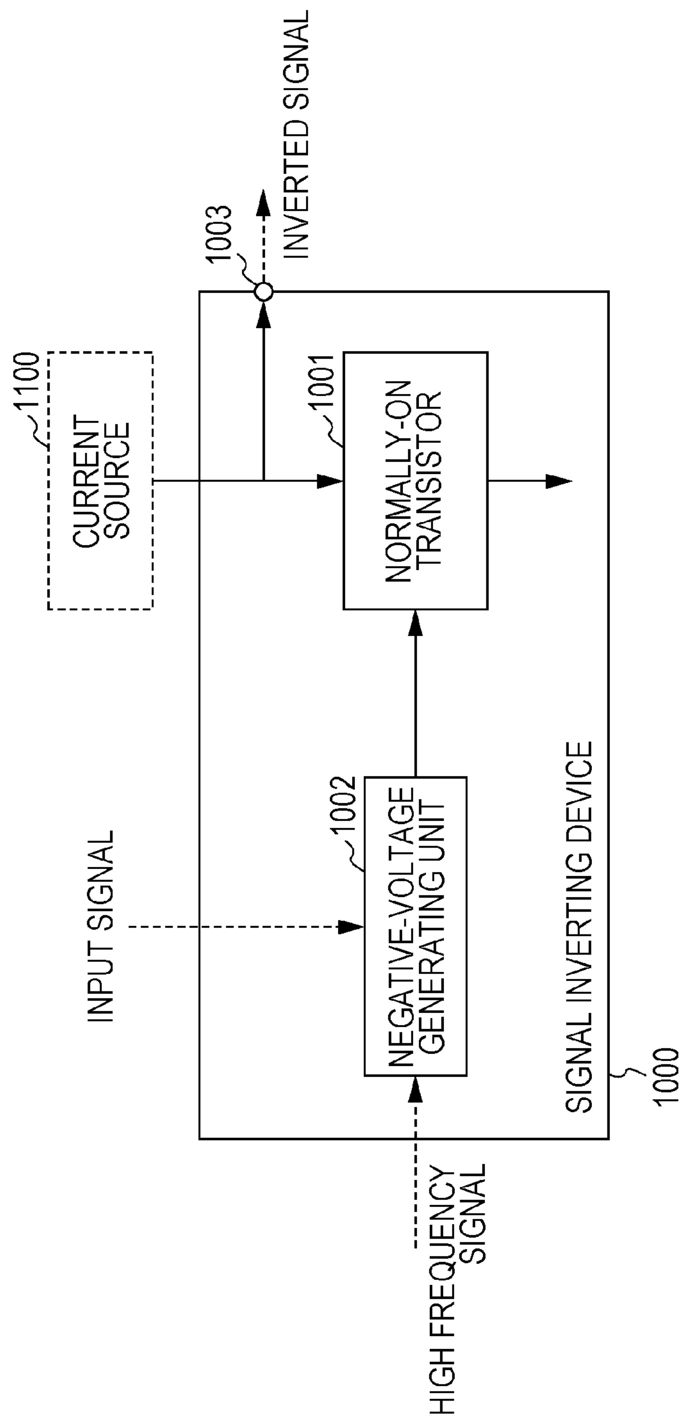
FIG. 1 is a diagram illustrating a general configuration of a signal inverting device according to a first embodiment.

FIG. 1 is a diagram illustrating a general configuration of a signal inverting device 1000 according to a first embodiment.

The signal inverting device 1000 according to the first embodiment generates an inverted signal obtained by inverting an input signal.

The signal inverting device 1000 according to the first embodiment includes a normally-on transistor 1001, a negative-voltage generating unit 1002, and an output terminal 1003.

The negative-voltage generating unit 1002 generates a negative voltage.

A first terminal (for example, the drain terminal) of the normally-on transistor 1001 is connected to a current source 1100.

The output terminal 1003 is connected between the first terminal of the normally-on transistor 1001 and the current source 1100.

A drive signal obtained by synthesizing the input signal and the negative voltage is input to the conduction control terminal (for example, the gate terminal) of the normally-on transistor 1001. Thus, the normally-on transistor 1001 is driven so as to be turned on/off.

In accordance with the on/off operation of the normally-on transistor 1001, an inverted signal is output from the output terminal 1003.

The negative-voltage generating unit 1002 rectifies high-frequency power, thereby generating a negative voltage.

In a device using high-frequency power (for example, a power transmission device described below), the above-described configuration enables the high-frequency power to be also used for generating an inverted signal. Thus, for example, a semiconductor IC or the like does not need to be used additionally in order to configure an inverted-signal generating circuit. As a result, the configuration of a device using high-frequency power (for example, a power transmission device described below) may be simplified, and may be reduced in size. Without using a normally-off transistor, a normally-on transistor (depression transistor) may be used to generate an inverted signal. Thus, for example, a hetero-field-effect transistor (HFET) which is an n-type semiconductor and which is a normally-on compound semiconductor may be used to make a logic circuit. Therefore, a device using high-frequency power (for example, a power transmission device described below) may be easily integrated with the signal inverting device.

The above-described high-frequency power may be, for example, power generated from a high-frequency power generating unit which will be described in a second embodiment described below.

Figure 2:
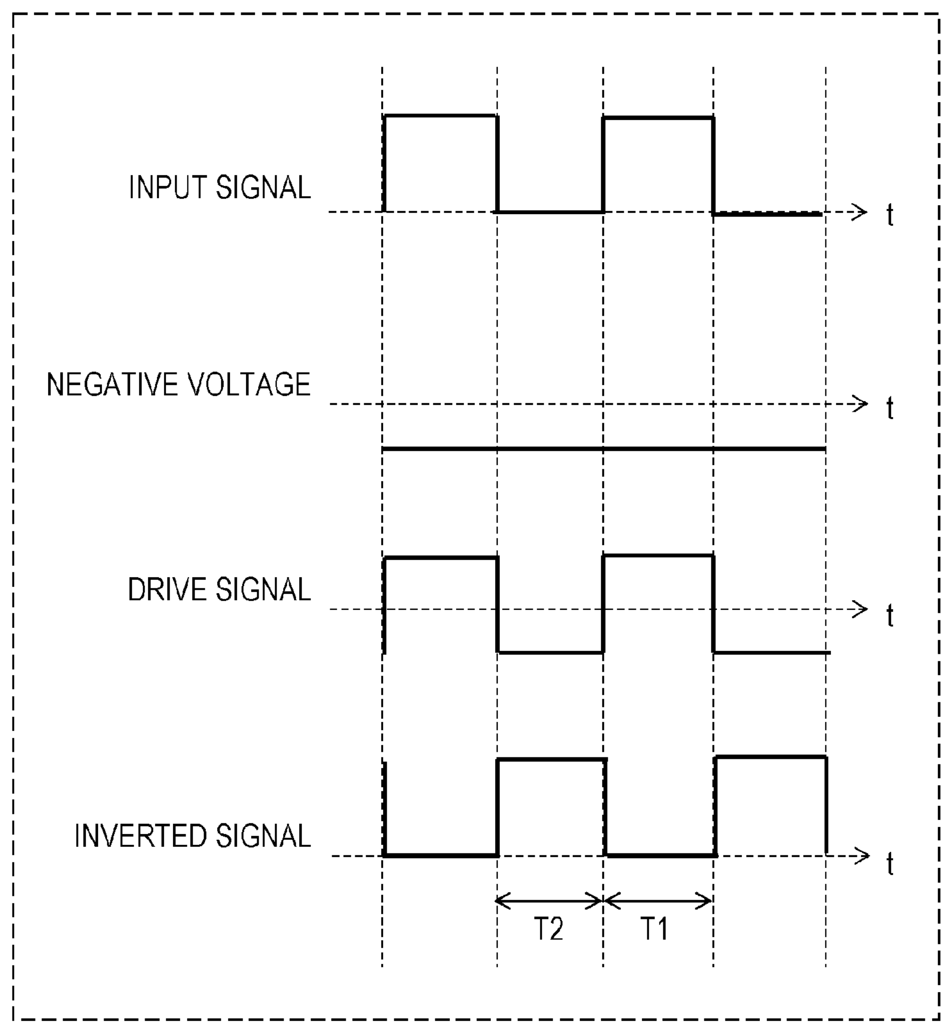
FIG. 2 is a diagram illustrating an example of an input signal, a drive signal, a negative voltage, and an inverted signal which are generated.

FIG. 2 is a diagram illustrating an example of the input signal, the drive signal, the negative voltage, and the inverted signal which are generated.

Figure 3A:
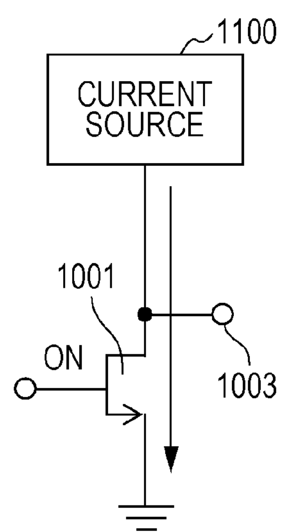
FIGS. 3A and 3B are diagrams illustrating current flows.
Figure 3B:
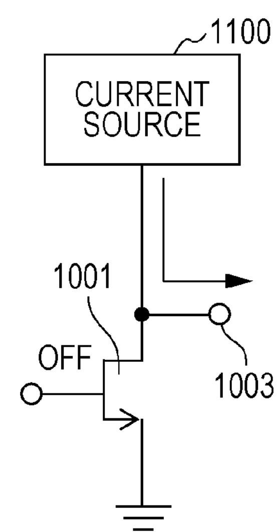

FIG. 3A is a diagram illustrating a current flow in a period T1 in FIG. 2. FIG. 3B is a diagram illustrating a current flow in a period T2 in FIG. 2.

As illustrated in FIG. 2, the inverted signal has an output voltage determined depending on the current source 1100.

As illustrated in the period T1 in FIG. 2, the drive signal is at High level in a period in which the input signal is at High level.

In this case, as illustrated in FIG. 3A, the normally-on transistor 1001 is turned on in the period T1. At that time, the output voltage is not output from the output terminal 1003.

In contrast, as illustrated in the period T2 in FIG. 2, the drive signal is at Low level in the period in which the input signal is at Low level.

In this case, as illustrated in FIG. 3B, the normally-on transistor 1001 is turned off in the period T2. At that time, the output voltage is output from the output terminal 1003.

The above-described configuration enables the inverted signal having a desired output voltage to be generated in accordance with the input signal.

Figure 4:
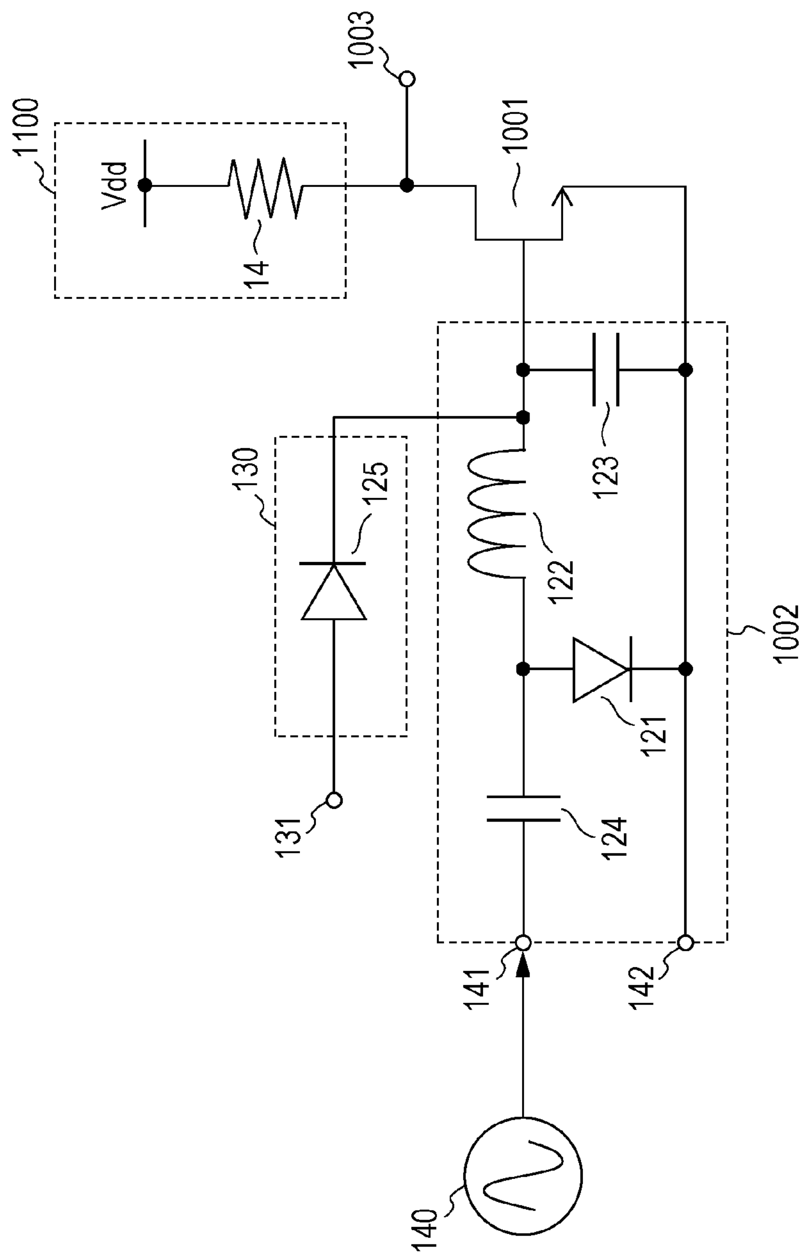
FIG. 4 is a diagram illustrating an exemplary specific configuration of the signal inverting device according to the first embodiment.

FIG. 4 is a diagram illustrating an exemplary specific configuration of the signal inverting device 1000 according to the first embodiment.

The exemplary configuration illustrated in FIG. 4 has a configuration described below.

The negative-voltage generating unit 1002 includes a signal terminal 141, a ground terminal 142, a diode 121, an inductor 122, and a capacitor 123.

The signal terminal 141 receives high-frequency power.

The signal terminal 141 and a first terminal of the inductor 122 are connected to each other at a first contact point.

The conduction control terminal of the normally-on transistor 1001 and a second terminal of the inductor 122 are connected to each other at a second contact point.

A second terminal (for example, the source terminal) of the normally-on transistor 1001 is connected to the ground terminal 142.

The capacitor 123 is connected between the second contact point and the path in which the second terminal of the normally-on transistor 1001 is connected to the ground terminal 142.

The anode of the diode 121 is connected to the first contact point.

The cathode of the diode 121 is connected to the path in which the second terminal of the normally-on transistor 1001 is connected to the ground terminal 142.

The above-described configuration enables a signal inverting device to be configured by using a small number of components. Therefore, a device using high-frequency power (for example, a power transmission device described below) may be easily integrated with the signal inverting device. In addition, a low-pass filter may be configured by using lumped components. Therefore, the negative-voltage generating unit may be reduced in size.

In the exemplary configuration illustrated in FIG. 4, the capacitor 123 and the inductor 122 constitute a low-pass filter.

As a modified example of the first embodiment, instead of the inductor 122, a transmission line having an inductance component may be provided. In this case, the capacitor 123 and the transmission line constitute a low-pass filter.

The above-described configuration enables a low-pass filter to be configured by using distributed parameters. Thus, even in the case where a higher frequency band (such as a millimeter wave band) is used, a low-loss filter may be configured.

The low-pass filter may be set to a value such that the output terminal of the negative-voltage generating unit 1002 is at the short-circuit point of the frequency of the high-frequency power.

The above-described configuration enables high-frequency power to be reflected at the output terminal of the negative-voltage generating unit. Therefore, the voltage value of the high frequency signal at an input unit (signal terminal) of the negative-voltage generating unit may be about double the voltage value of the input high-frequency power. Therefore, high-frequency power may be efficiently rectified by using the diode.

The negative-voltage generating circuit (for example, the negative-voltage generating unit 1002) according to the first embodiment may generate a negative voltage which is input to the conduction control terminal of a transistor, from high-frequency power which is output from the output terminal of an oscillator. In this case, high-frequency power is not radiated into space, and the output terminal of the oscillator may be connected to the signal terminal of the negative-voltage generating circuit. That is, the negative-voltage generating circuit may transmit high-frequency power which is output from the oscillator, directly to the signal terminal 141, not via an element, such as an antenna, which performs spatial propagation.

The above-described configuration causes high-frequency power not to be attenuated through the long-distance spatial propagation. As a result, highly efficient conversion may be allowed.

In the case where the negative-voltage generating unit 1002 needs to have a rectification property in the microwave band, a Schottky barrier diode may be used as the diode 121. In this case, a Schottky barrier diode made from GaN may be used as the diode 121. A Schottky barrier diode made from GaN has a high frequency property, low Vf, and low on-resistance.

In the exemplary configuration illustrated in FIG. 4, the negative-voltage generating unit 1002 includes a second capacitor 124.

The second capacitor 124 is disposed between the signal terminal 141 and the first terminal of the inductor 122.

The above-described configuration enables the second capacitor to operate as a high frequency filter for high frequency matching. In addition, the configuration enables the second capacitor to operate as a high frequency filter which is used to prevent backflow of direct current which is rectified by the negative-voltage generating unit, to the signal terminal. The capacity of the second capacitor is adjusted, whereby the input high-frequency power may be maximized.

In the exemplary configuration illustrated in FIG. 4, the signal inverting device 1000 includes a level shift unit 130.

The level shift unit 130 changes the voltage level of the input signal.

In this case, the drive signal is obtained by synthesizing the negative voltage and the input signal whose voltage level has been changed by the level shift unit 130.

The above-described configuration enables the voltage level of the input signal to be adjusted, for example, in accordance with the level of high-frequency power (the level of the generated negative voltage). Thus, an adequate drive signal may be generated, and may be supplied to the normally-on transistor. Therefore, the normally-on transistor may be driven so as to be turned on/off with higher accuracy.

The level shift unit 130 adjusts the voltage amplitude of the input voltage signal. Thus, the normally-on transistor 1001 which has been biased to a negative voltage is turned on with an adequate bias.

In the first embodiment, one or more diodes may be connected to each other in series to perform level shifting.

In the exemplary configuration illustrated in FIG. 4, a diode 125 constitutes a level shift unit 130.

Assume that the normally-on transistor 1001 in the exemplary configuration in FIG. 4 is, for example, an HFET which is made from GaN and whose threshold is equal to −2.5 V. In this case, the negative-voltage generating unit 1002 biases the normally-on transistor 1001 to about −3 V, and turns off the normally-on transistor 1001.

For example, in the case where the input signal of rectangular wave of 5V/0V is input, if the input signal is input as is, the gate bias produced when the normally-on transistor 1001 is turned on is +2.5 V. This voltage is sufficient to turn on the normally-on transistor 1001. However, this voltage causes an excess current flow, resulting in large power consumption. Therefore, Vf of the diode 125 is used to drop the voltage of the input signal to about 2.5 V. In this example, three diodes were connected to each other in series, whereby the bias was adequately adjusted.

The diode 125 prevents backflow of the direct current generated by the negative-voltage generating unit 1002, to the input signal terminal.

When a Schottky barrier diode is used in the negative-voltage generating unit 1002, the diode 125 may be also a Schottky barrier diode. Thus, these may be fabricated in a single process.

In the exemplary configuration illustrated in FIG. 4, the signal inverting device 1000 includes a resistor 14 as an element having a resistance component.

The resistor 14 is connected between the voltage source Vdd and the output terminal 1003.

The above-described configuration enables a current source to be configured by using simple components, such as a voltage source and a resistor.

The power supply voltage Vdd may be equal to the voltage amplitude of the input signal.

Figure 5:
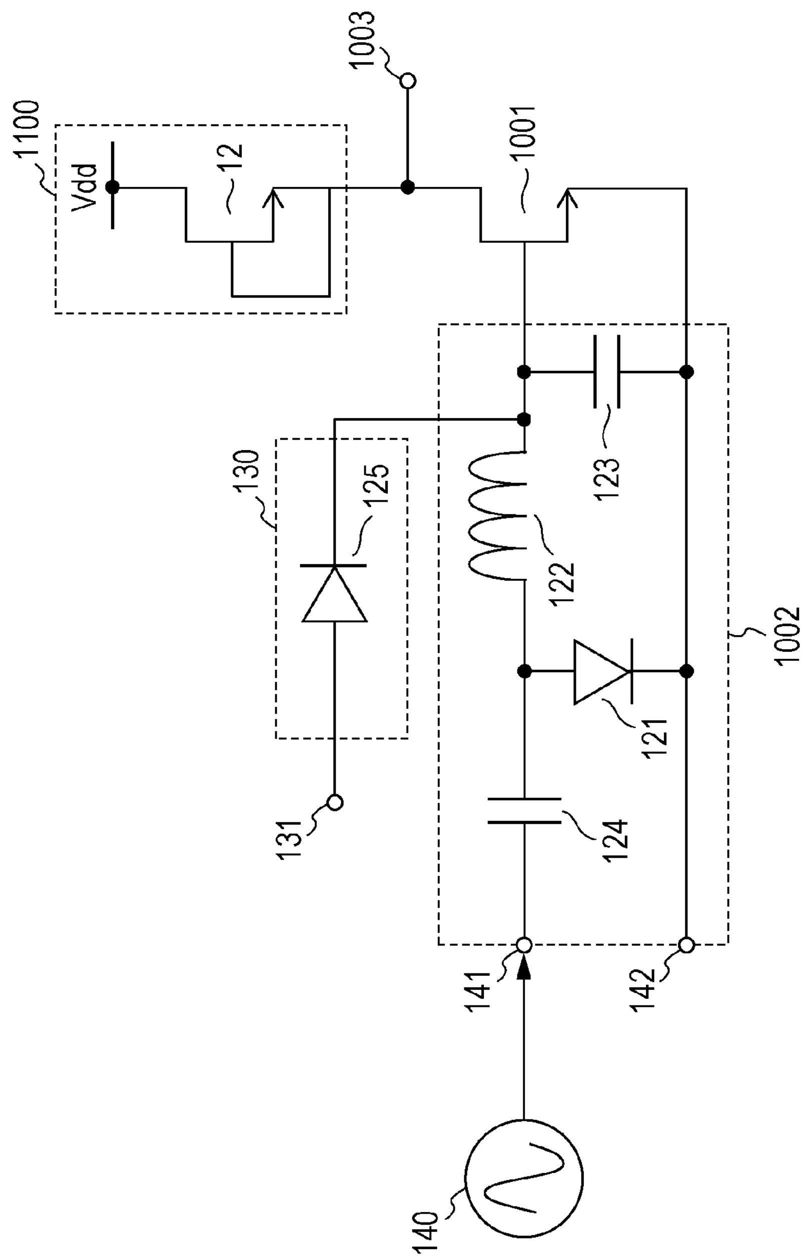
FIG. 5 is a diagram illustrating another exemplary specific configuration of the signal inverting device according to the first embodiment.

FIG. 5 is a diagram illustrating another exemplary specific configuration of the signal inverting device 1000 according to the first embodiment.

In the exemplary configuration illustrated in FIG. 5, the signal inverting device 1000 includes a transistor 12 as an element (for example, a load) having a resistance component.

A first terminal (for example, the drain terminal) of the transistor 12 is connected to the voltage source Vdd.

A second terminal (for example, the source terminal) of the transistor 12 is connected to the output terminal 1003 and the first terminal (for example, the drain terminal) of the normally-on transistor 1001.

The conduction control terminal (for example, the gate terminal) of the transistor 12 is connected to the second terminal (for example, the source terminal) of the transistor 12.

The above-described configuration has following effects in comparison with the configuration using the resistor 14 which is illustrated in FIG. 4.

That is, current (output current) flowing through the transistor may be made constant. That is, current consumption does not increase in accordance with a change in the power supply voltage Vdd, achieving suppression of an increase of power consumption. In the configuration using the resistor 14 which is illustrated in FIG. 4, the current which is output from the current source 1100 depends on the value of the resistor 14 on the basis of Ohm's law. Therefore, a high voltage applied to the voltage source Vdd causes the power consumption to be increased. Accordingly, as illustrated in FIG. 5, the second terminal of the transistor 12 is connected to the conduction control terminal, and the second terminal and the conduction control terminal are at conduction potential. Thus, even when a high voltage is applied to the voltage source Vdd, the value of current which is output from the current source 1100 is constant. Therefore, the power consumption may be suppressed.

In the configuration using the resistor 14 illustrated in FIG. 4, the output voltage from the output terminal 1003 has a value determined in consideration of a voltage drop caused by the resistor 14. Therefore, the design of the current source 1100 gets complicated. In contrast, in the configuration using the transistor 12 illustrated in FIG. 5, since the on-resistance of the transistor is small, the voltage drop is small. Therefore, the voltage applied to the voltage source Vdd may be output, for example, as is. Accordingly, the design of the current source 1100 may be simplified.

In the exemplary configuration illustrated in FIG. 5, the source electrode and the drain electrode of the transistor 12 are short-circuited. In this case, the power supply voltage Vdd of the transistor 12 is approximately equal to the voltage amplitude of the inverted signal. Therefore, the power supply voltage Vdd may be equal to the voltage amplitude of the input signal.

In the exemplary configuration illustrated in FIG. 5, the gate width of the transistor 12 may be smaller than that of the normally-on transistor 1001.

The above-described configuration enables the value of current flowing from the voltage source Vdd to the output terminal 1003 or to the normally-on transistor 1001 to be decreased. Thus, the power consumption may be reduced. In addition, even in the case where the flowing current is decreased by increasing the gate width of the normally-on transistor 1001 so as to reduce the on-resistance, a voltage drop produced in the normally-on transistor 1001 may be suppressed. Therefore, an excess voltage may be prevented from being applied when the output signal is off.

For example, the gate width of the transistor 12 may be 100 μm, and the gate width of the normally-on transistor 1001 may be 3000 μm.

The transistor 12 may be a normally-on transistor.

FIG. 6 is a diagram illustrating an operation simulation result obtained by using the circuit configuration illustrated in FIG. 5.

In this simulation, 15 dBm of 2.4-GHz high frequency signal was input from a high-frequency oscillation circuit 140 to the input terminal 141 of the negative-voltage generating unit 1002. In addition, a high/low (5 V/0 V) signal was input to an input terminal 131 of the level shift circuit 130 (in FIG. 6A). The voltage Vdd of the voltage source was set to 5 V.

Figure 6B:
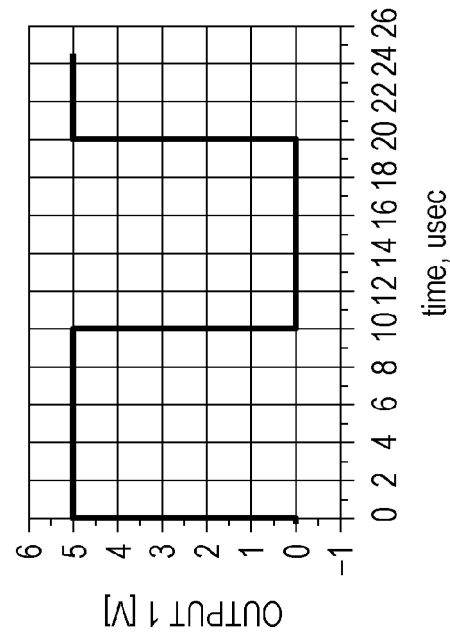
FIGS. 6A and 6B are diagrams illustrating an operation simulation result obtained by using the circuit configuration illustrated in FIG. 5.
Figure 6A:
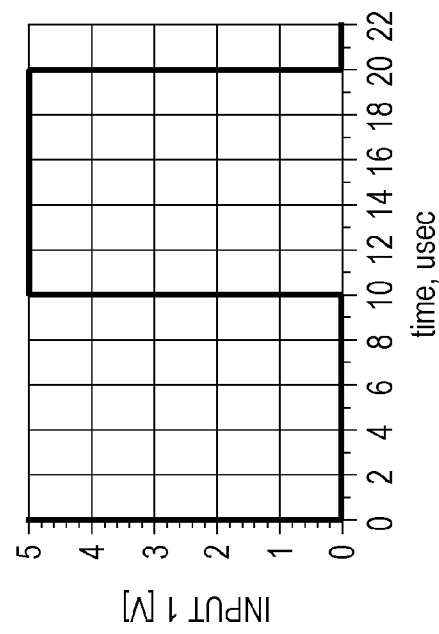

FIG. 6B illustrates an output voltage waveform produced at that time. It was confirmed that the input signal is inverted by using a voltage amplitude of 5V.

Figure 7:
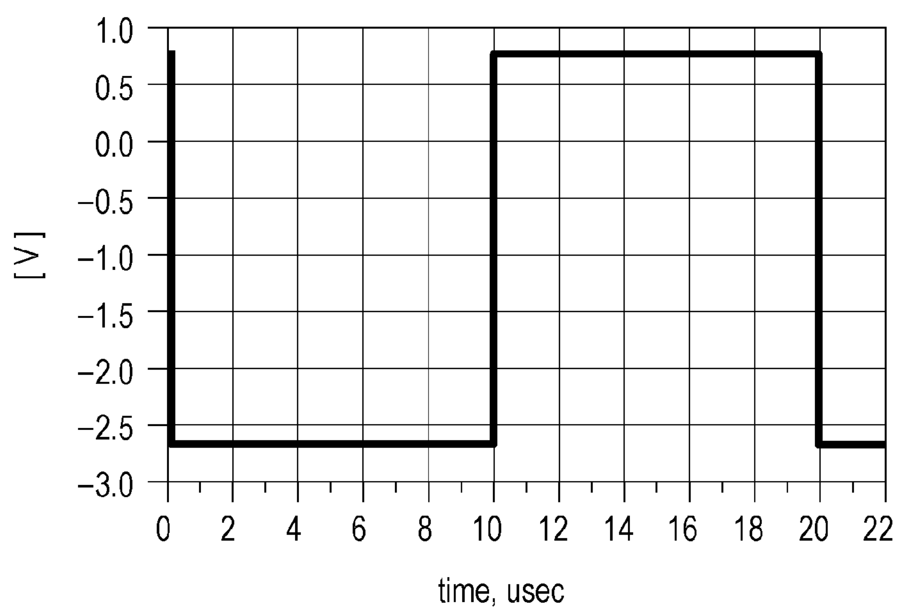
FIG. 7 is a diagram illustrating a voltage waveform at the gate terminal of a normally-on transistor.

FIG. 7 is a diagram illustrating the voltage waveform produced at the gate terminal of the normally-on transistor 1001 at that time. When the input signal is off, the gate voltage is biased to a negative voltage. At that time, the normally-on transistor 1001 is completely turned off.

Second Embodiment

FIG. 8 is a diagram illustrating a general configuration of a power transmission device 2000 and a power transmission device 3000 according to the second embodiment.

The power transmission device 2000 according to the second embodiment includes the signal inverting device 1000, a first resonance coupler 2101, a second resonance coupler 2102, a modulation unit 2200, and a high-frequency power generating unit 2300.

The signal inverting device 1000 is the signal inverting device described in the first embodiment.

The modulation unit 2200 modulates high-frequency power from the high-frequency power generating unit 2300 in accordance with an input signal 501, and generates a first modulated signal. The modulation unit 2200 supplies the first modulated signal to the first resonance coupler 2101.

The modulation unit 2200 modulates high-frequency power from the high-frequency power generating unit 2300 in accordance with an inverted signal 502 from the output terminal 1003, and generates a second modulated signal. The modulation unit 2200 supplies the second modulated signal to the second resonance coupler 2102.

The high-frequency power generating unit 2300 supplies high-frequency power to the negative-voltage generating unit 1002.

The negative-voltage generating unit 1002 rectifies the high-frequency power supplied from the high-frequency power generating unit 2300, thereby generating a negative voltage.

The above-described configuration enables high-frequency power from the high-frequency power generating unit to be also used for generating the inverted signal. Thus, a power source for generating a negative voltage which needs to generate the inverted signal does not need to be provided additionally. As a result, the configuration of the power transmission device may be simplified, and may be reduced in size. Without using a normally-off transistor, a normally-on transistor (depression transistor) may be used to generate the inverted signal. Thus, for example, an HFET which is an n-type semiconductor and which is a normally-on compound semiconductor may be used to make a logic circuit. Therefore, a power transmission device including the signal inverting unit may be easily integrated.

The high-frequency power generating unit 2300 generates high-frequency power (for example, microwave power).

The high-frequency power may have a predetermined amplitude and a predetermined frequency. The frequency of the high-frequency power may be, for example, 2.4 GHz, 5.8 GHz, or the like which is one of the Industry-Science-Medical (ISM) bands. The high-frequency power may have a frequency of 1 MHz or more. The high-frequency power may be slightly distorted.

As the high-frequency power generating unit 2300, for example, a Colpitts oscillator, a Hartley oscillator, an oscillator which produces another microwave, or the like may be used.

The high-frequency power generating unit 2300 may include a frequency regulation mechanism to cope with a change in the frequency of high-frequency power.

For example, the modulation unit 2200 mixes the input signal with the high-frequency power so as to generate the first modulated signal.

For example, the modulation unit 2200 mixes the inverted signal with the high-frequency power so as to generate the second modulated signal.

The first modulated signal and the second modulated signal which are generated by the modulation unit 2200 may have, for example, a complementary relationship with each other.

The modulation unit 2200 may be, for example, a differential mixer (mixing circuit). The differential mixer is capable of modulating a high frequency signal with low loss. The differential mixer may be provided with multiple input/output terminals.

Instead, the modulation unit 2200 may be a switching circuit. When a switching circuit is used as the modulation unit 2200, isolation among the output terminals of the modulation unit 2200 is improved. In addition, a matching circuit such as an inductor is not necessary. Therefore, the power transmission device may be reduced in size.

Figure 9:
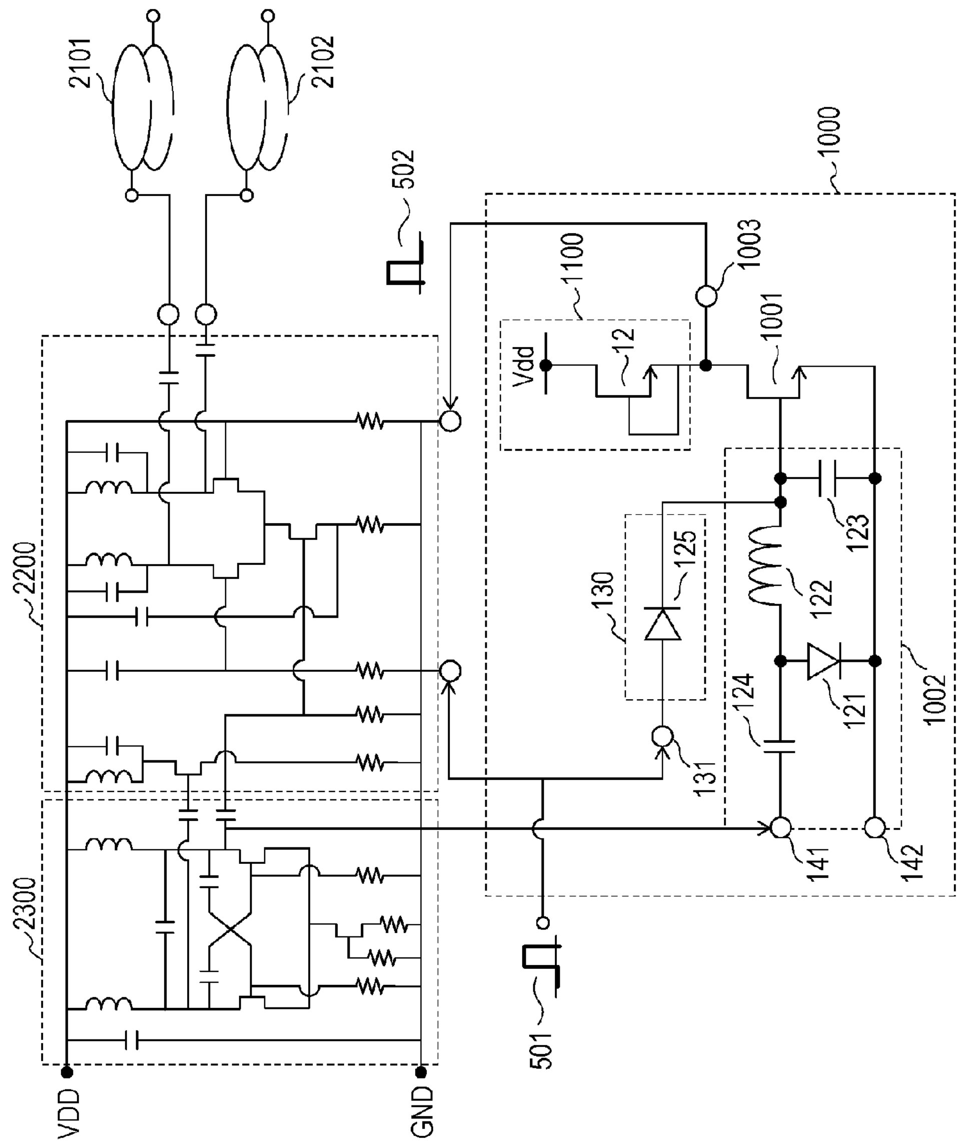
FIG. 9 is a diagram illustrating an exemplary specific configuration of a power transmission device according to the second embodiment.

FIG. 9 is a diagram illustrating an exemplary specific configuration of the power transmission device 2000 according to the second embodiment.

In the exemplary configuration in FIG. 9, the high-frequency power generating unit 2300 is configured by using an LC-tank differential oscillator constituted by using an inductor and a capacitor.

In the exemplary configuration in FIG. 9, the modulation unit 2200 is a differential mixer (mixing circuit). A preamplifier is provided upstream of the core portion of the mixer circuit so that a signal is amplified.

A circuit in the exemplary configuration in FIG. 9 may be formed by using an HFET made from GaN.

Figure 10:
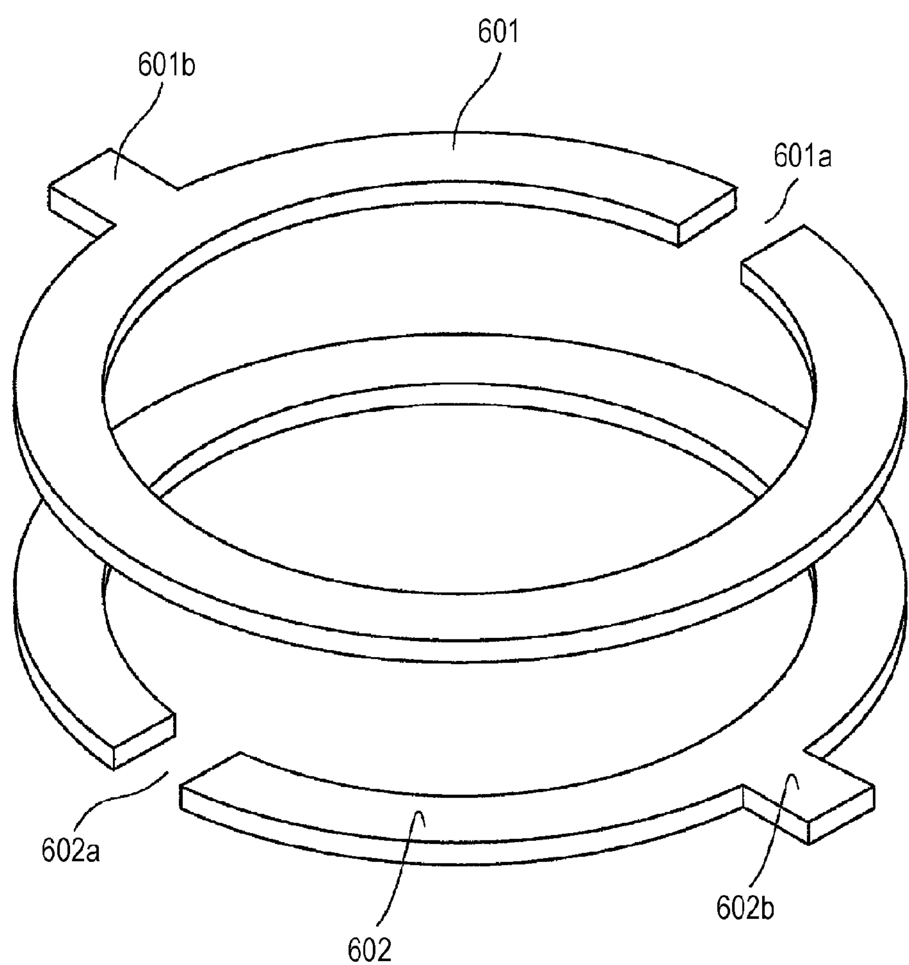
FIG. 10 is a diagram illustrating an exemplary resonance coupler.

FIG. 10 is a diagram illustrating a resonance coupler.

The resonance coupler has a first resonator 601 and a second resonator 602.

A signal to be transmitted is transmitted in an insulated manner (non-contact transmission) between the first resonator 601 and the second resonator 602, for example, by using electromagnetic field resonance.

The first resonator 601 and the second resonator 602 are transmission lines, each of which has a ring shape with an opening and which are made of metal lines.

For example, the first resonator 601 and the second resonator 602 have openings 601*a* and 602*a*, respectively, at any positions on the transmission lines.

For example, the first resonator 601 and the second resonator 602 have terminals 601*b* and 602*b*, respectively, at any positions on the transmission lines. A transmission signal is input/output from/to the resonators through the terminals.

The first resonator 601 and the second resonator 602 are disposed so as to be spaced apart by a predetermined distance and be opposite each other.

For example, the line length of each of the first resonator 601 and the second resonator 602 is about half the wavelength of a signal to be transmitted. As a signal to be transmitted has a higher frequency, each resonator is reduced in size.

The outline of the resonance coupler may be circular or rectangular.

The power transmission device 3000 according to the second embodiment includes a first rectifying unit 3101 and a second rectifying unit 3102 in addition to the above-described configuration of the power transmission device 2000.

The first rectifying unit 3101 rectifies the first modulated signal which has been transmitted in an insulated manner by the first resonance coupler 2101, thereby generating a first output signal having a positive voltage.

The second rectifying unit 3102 rectifies the second modulated signal which has been transmitted in an insulated manner by the second resonance coupler 2102, thereby generating a second output signal having a negative voltage.

The power transmission device 3000 outputs an output signal obtained by synthesizing the first output signal and the second output signal.

For example, in the case where the output signal of the power transmission device is used as a gate drive signal of a power semiconductor switching device, the above-described configuration enables a negative voltage to be supplied when the power semiconductor switching device is to be turned off. That is, when the power semiconductor switching device is switched from on to off, charge stored in the gate of the power semiconductor switching device may be extracted. Thus, the power semiconductor switching device may be switched to off swiftly. As a result, a switching operation performed by the power semiconductor switching device may be achieved with a short turn-off time.

Figure 11:
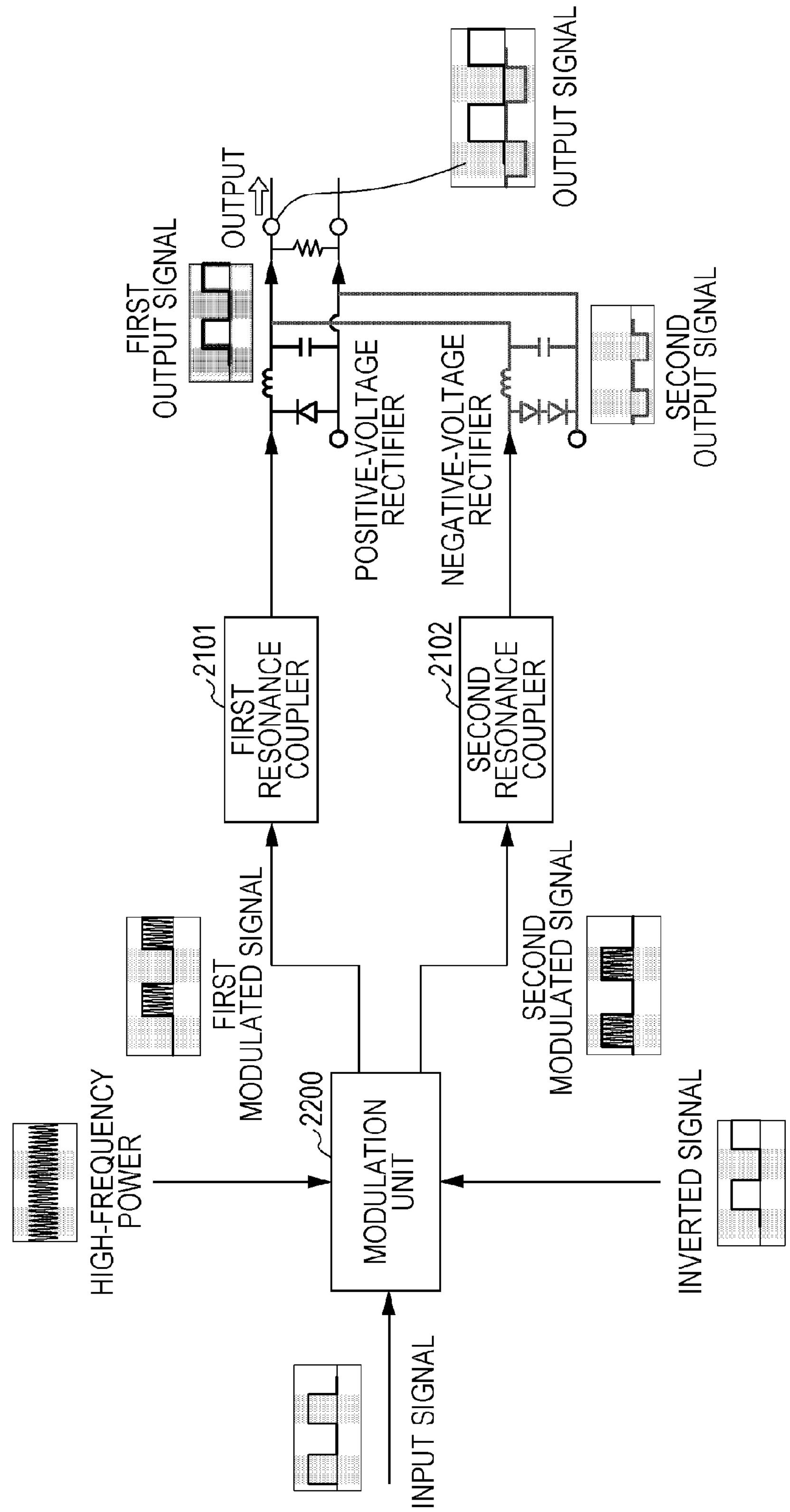
FIG. 11 is a diagram illustrating an exemplary first rectifying unit and an exemplary second rectifying unit.

FIG. 11 is a diagram illustrating an example of the first rectifying unit 3101 and the second rectifying unit 3102.

As illustrated in FIG. 11, a positive-voltage rectifier which is the first rectifying unit 3101 generates the first output signal having a positive voltage according to the input signal.

As illustrated in FIG. 11, a negative-voltage rectifier which is the second rectifying unit 3102 generates the second output signal having a negative voltage according to the inverted signal.

In the exemplary configuration in FIG. 11, the first output signal and the second output signal are synthesized so that an output signal is output.

The output signal may be supplied, for example, to a power device (power semiconductor switching device) as a gate drive signal.

The above-described configuration enables a negative voltage to be supplied to the gate terminal of a power device when the power device is to be turned off. Thus, the charge at the gate terminal may be extracted. Accordingly, the voltage at the gate terminal is swiftly decreased. Thus, high-speed driving of the power device is achieved.

Third Embodiment

FIG. 12 is a diagram illustrating a general configuration of a power transmission device 4000 according to a third embodiment.

Repeated description about a configuration corresponding to that of the power transmission device 2000 which is described in the second embodiment will be avoided.

The power transmission device 4000 according to the third embodiment further includes a first rectifying unit 40*a*, a second rectifying unit 40*b*, a third rectifying unit 40*c*, a third resonance coupler 2103, an output selecting circuit 60, and a third capacitor 50 in addition to the configuration of the power transmission device 2000.

The high-frequency power generating unit 2300 supplies high-frequency power to the third resonance coupler 2103.

The first rectifying unit 40*a* rectifies the first modulated signal which has been transmitted in an insulated manner by the first resonance coupler 2101, thereby generating a first output signal 508.

The second rectifying unit 40*b* rectifies the second modulated signal which has been transmitted in an insulated manner by the second resonance coupler 2102, thereby generating a second output signal 509.

The third rectifying unit 40*c* rectifies a third modulated signal which has been transmitted in an insulated manner by the third resonance coupler 2103, thereby generating a third output signal 507.

The third capacitor 50 is supplied with the third output signal 507, whereby a charge builds up.

The output selecting circuit 60 selects whether or not the charge in the third capacitor 50 is to be output, in accordance with the first output signal 508 and the second output signal 509.

The above-described configuration enables a large current to be output instantaneously. Thus, for example, a large current may be instantaneously supplied to the semiconductor switching device 1. In addition, high-frequency power may be transmitted in an insulated manner not through the modulation unit 2200. Thus, a larger amount of power may be transmitted in an insulated manner to the third capacitor 50.

In the power transmission device 4000 according to the third embodiment, the output selection unit 60 may be configured by using a half-bridge circuit. In this case, the half-bridge circuit may include a transistor 61 and a transistor 62. In this case, the first output signal 508 may be input to the conduction control terminal of the transistor 61. In addition, the second output signal 509 may be input to the conduction control terminal of the transistor 62.

The output signal from the output terminal 71 of the output selection unit 60 may be input to the conduction control terminal of the semiconductor switching device 1. The output signal from the output selection unit 60 may be used to control switching of the semiconductor switching device 1.

Figure 13B:
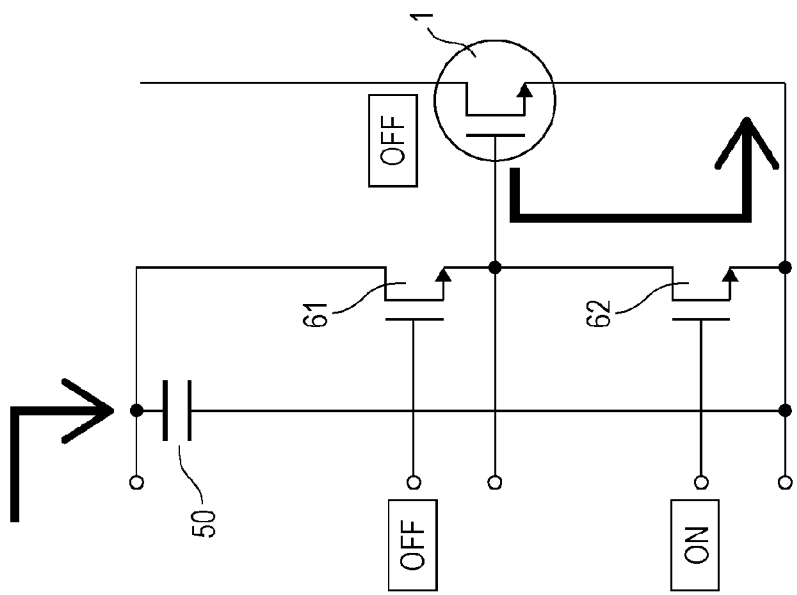
FIGS. 13A and 13B are diagrams for describing exemplary operations of a half-bridge circuit which is an exemplary output selection unit.
Figure 13A:
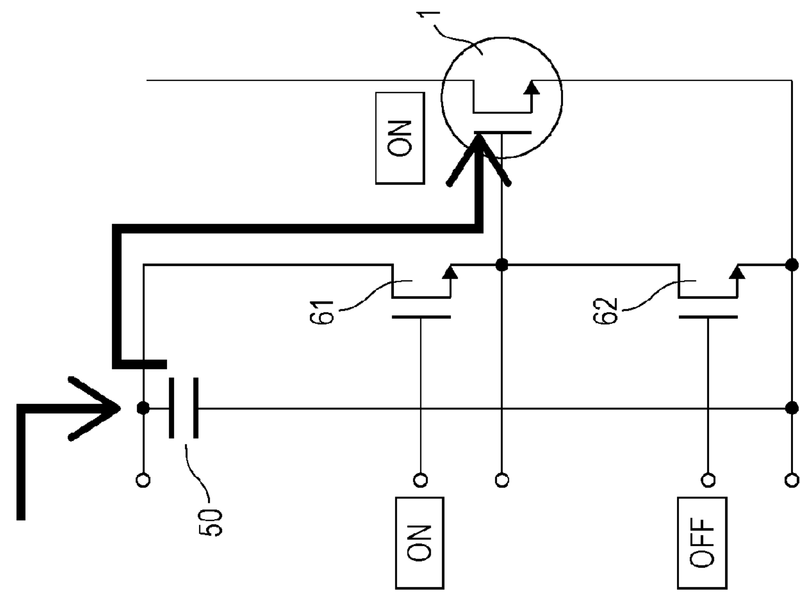

FIGS. 13A and 13B are diagrams for describing exemplary operations of the half-bridge circuit 60 which is an exemplary output selection unit 60.

Figure 14:
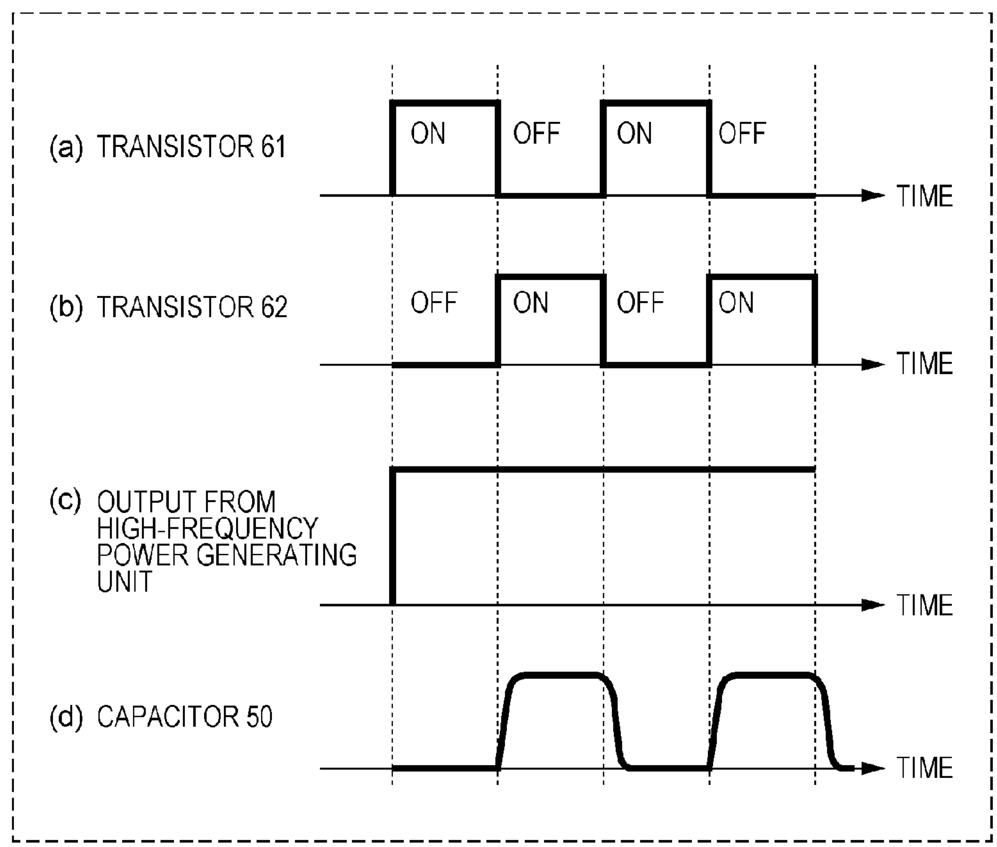
FIG. 14 is a diagram illustrating the relationship among charge in a capacitor and the voltages across the gate-source terminals of transistors.

FIG. 14 is a diagram illustrating the relationship among the voltage across the gate-source terminals of the transistor 61, that of the transistor 62, and the charge stored in the capacitor 50.

The voltage across the gate-source terminals is the voltage of the gate terminal based on that of the source terminal of each transistor.

As illustrated in FIGS. 14(*a*) and 14(*b*), the half-bridge circuit 60 repeatedly switches between the following states in accordance with the first output signal 508 and the second output signal 509 which are input control signals: a state in which the transistor 61 is on (in the conducting state) and in which the transistor 62 is off (in the non-conducting state); and a state in which the transistor 61 is off and in which the transistor 62 is on.

The half-bridge circuit 60 supplies the charge (that is, drive power) stored in the capacitor 50 to the semiconductor switching device 1 in accordance with the input signal. That is, the semiconductor switching device 1 is turned on (in the conducting state).

FIG. 13B is a diagram illustrating the case in which the transistor 61 is off and in which the transistor 62 is on.

That is, FIG. 13B is a diagram illustrating the case in which the off voltage is applied across the gate-source terminals of the transistor 61 and in which the on voltage is applied across the gate-source terminals of the transistor 62.

In the state in FIG. 13B, a charge builds up the capacitor 50. However, since the transistor 61 is in the off state, the semiconductor switching device 1 is not supplied with current. That is, the semiconductor switching device 1 is turned off (in the non-conducting state).

In contrast, FIG. 13A is a diagram illustrating the case in which the transistor 61 is on and in which the transistor 62 is off.

That is, FIG. 13A is a diagram illustrating the case in which the on voltage is applied across the gate-source terminals of the transistor 61 and in which the off voltage is applied across the gate-source terminals of the transistor 62.

In the state in FIG. 13A, the charge stored in the capacitor 50 in the state in FIG. 13B is supplied to the gate terminal of the semiconductor switching device 1.

When the state in FIG. 13A is switched to the state in which the transistor 61 is off and in which the transistor 62 is on, as illustrated in FIG. 14(*d*), the charge stored in the capacitor 50 is increased again. The charge stored at the gate terminal of the semiconductor switching device 1 is discharged to an output reference terminal 72 by the transistor 62.

The above-described operation enables the drive device according to the third embodiment to supply a large current to the semiconductor switching device 1 instantaneously.

The signal inverting device or the power transmission devices according to the first to third embodiments may be integrated as a semiconductor. The configuration of the signal inverting device and the power transmission devices according to the first to third embodiments enables all of the devices to be fabricated in a single semiconductor process.

The present disclosure may be used, for example, as a gate drive circuit driving a power semiconductor device.

While the present disclosure has been described with respect to exemplary embodiments thereof, it will be apparent to those skilled in the art that the disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A signal inverting device generating an inverted signal of an input signal, comprising:

a normally-on transistor;

a negative-voltage generating unit that generates a negative voltage; and an output terminal, wherein a first terminal of the normally-on transistor is connected to a current source, the output terminal is connected between the first terminal of the normally-on transistor and the current source, the normally-on transistor is turned on/off, by an input of a drive signal to a conduction control terminal of the normally-on transistor, the drive signal being a signal obtained by a synthesis of the input signal and the negative voltage, the inverted signal is output from the output terminal in accordance with the on/off operation of the normally-on transistor, and the negative-voltage generating unit generates the negative voltage by rectifying a high-frequency power.

2. The signal inverting device according to claim 1, wherein the inverted signal has an output voltage determined depending on the current source, in a period in which the input signal is at High level, the output voltage is not output from the output terminal with the normally-on transistor being in the on state with the drive signal being at High level, and in a period in which the input signal is at Low level, the output voltage is output from the output terminal with the normally-on transistor being in the off state with the drive signal being at Low level.

3. The signal inverting device according to claim 1, wherein the negative-voltage generating unit includes a signal terminal to which the high-frequency power is input, a ground terminal, a diode, an inductor, and a capacitor, the signal terminal and a first terminal of the inductor are connected to each other at a first contact point, the conduction control terminal of the normally-on transistor and a second terminal of the inductor are connected to each other at a second contact point, a second terminal of the normally-on transistor is connected to the ground terminal, the capacitor is connected between the second contact point and a path in which the second terminal of the normally-on transistor is connected to the ground terminal, an anode of the diode is connected to the first contact point, and a cathode of the diode is connected to the path in which the second terminal of the normally-on transistor is connected to the ground terminal.

4. The signal inverting device according to claim 3, wherein the capacitor and the inductor form a low-pass filter, and the low-pass filter is set to a value with an output terminal of the negative-voltage generating unit being at a short-circuit point of a frequency of the high-frequency power.

5. The signal inverting device according to claim 3, comprising:

instead of the inductor, a transmission line having an inductance component.

6. The signal inverting device according to claim 5, wherein the capacitor and the transmission line form a low-pass filter, and the low-pass filter is set to a value with an output terminal of the negative-voltage generating unit being at a short-circuit point of a frequency of the high-frequency power.

7. The signal inverting device according to claim 3, wherein the negative-voltage generating unit includes a second capacitor, and the second capacitor is disposed between the signal terminal and the first terminal of the inductor.

8. The signal inverting device according to claim 1, further comprising:

a level shift unit, wherein the level shift unit changes a voltage level of the input signal, and the drive signal is a signal obtained by a synthesis of the negative voltage and the input signal whose voltage level has been changed by the level shift unit.

9. The signal inverting device according to claim 1, further comprising:

an element having a resistance component;

wherein the element having the resistance component is connected between a voltage source and the output terminal.

10. The signal inverting device according to claim 9, wherein the element having the resistance component is a transistor, a first terminal of the transistor is connected to the voltage source, a second terminal of the transistor is connected to the output terminal, and a conduction control terminal of the transistor is connected to the second terminal of the transistor.

11. The signal inverting device according to claim 10, wherein a gate width of the transistor is smaller than a gate width of the normally-on transistor.

12. A power transmission device comprising:

the signal inverting device according to claim 1;

a first resonance coupler;

a second resonance coupler;

a modulation unit; and a high-frequency power generating unit, wherein the modulation unit modulates high-frequency power from the high-frequency power generating unit in accordance with the input signal to generate a first modulated signal, and supplies the first modulated signal to the first resonance coupler, the modulation unit modulates the high-frequency power from the high-frequency power generating unit in accordance with the inverted signal to generate a second modulated signal, and supplies the second modulated signal to the second resonance coupler, the high-frequency power generating unit supplies the high-frequency power to the negative-voltage generating unit, and the negative-voltage generating unit rectifies the high-frequency power supplied from the high-frequency power generating unit, to generate the negative voltage.

13. The power transmission device according to claim 12, further comprising:

a first rectifying unit; and a second rectifying unit, wherein the first rectifying unit rectifies the first modulated signal which has been transmitted in an insulated manner by the first resonance coupler, to generate a first output signal having a positive voltage, the second rectifying unit rectifies the second modulated signal which has been transmitted in an insulated manner by the second resonance coupler, to generate a second output signal having a negative voltage, and an output signal is output, the output signal being obtained by a synthesis of the first output signal and the second output signal.

14. The power transmission device according to claim 12, further comprising:

a first rectifying unit;

a second rectifying unit;

a third rectifying unit;

a third resonance coupler;

an output selecting circuit; and a third capacitor, wherein the high-frequency power generating unit supplies the high-frequency power to the third resonance coupler, the first rectifying unit rectifies the first modulated signal which has been transmitted in an insulated manner by the first resonance coupler, to generate a first output signal, the second rectifying unit rectifies the second modulated signal which has been transmitted in an insulated manner by the second resonance coupler, to generate a second output signal, the third rectifying unit rectifies a third modulated signal which has been transmitted in an insulated manner by the third resonance coupler, to generate a third output signal, the third capacitor is supplied with the third output signal to store charge, and the output selecting circuit selects whether or not the charge in the third capacitor is to be output, in accordance with the first output signal and the second output signal.

15. A negative-voltage generating circuit generating a negative voltage from high-frequency power which is output from an output terminal of an oscillator, the negative voltage being input to a conduction control terminal of a transistor, comprising:

a signal terminal to which the high-frequency power is input;

a ground terminal;

a diode;

an inductor; and a capacitor, wherein the signal terminal and a first terminal of the inductor are connected with each other at a first contact point, the conduction control terminal of the transistor and a second terminal of the inductor are connected to each other at a second contact point, a second terminal of the transistor is connected to the ground terminal, the capacitor is connected between the second contact point and a path in which the second terminal of the transistor is connected to the ground terminal, an anode of the diode is connected to the first contact point, a cathode of the diode is connected to the path in which the second terminal of the transistor is connected to the ground terminal, and the output terminal of the oscillator is connected to the signal terminal.

16. The negative-voltage generating circuit according to claim 15, comprising:

a transmission line instead of the inductor.

* * * * *